United States Patent [19]

Hawkins

[11] Patent Number: 4,639,277

[45] Date of Patent: Jan. 27, 1987

[54] SEMICONDUCTOR MATERIAL ON A SUBSTRATE, SAID SUBSTRATE COMPRISING, IN ORDER, A LAYER OF ORGANIC POLYMER, A LAYER OF METAL OR METAL ALLOY AND A LAYER OF DIELECTRIC MATERIAL

[75] Inventor: Gilbert A. Hawkins, Mendon, N.Y.

[73] Assignee: Eastman Kodak Company, Rochester, N.Y.

[21] Appl. No.: 626,848

[22] Filed: Jul. 2, 1984

[51] Int. Cl.[4] .................. H01L 27/12; H01L 29/04
[52] U.S. Cl. .................. 148/33.3; 29/576 E; 29/576 T; 136/245; 136/258; 148/DIG. 54; 357/59; 357/71; 428/620; 430/5; 430/296; 430/942
[58] Field of Search ............... 148/1.5, 33.3, 174, 148/DIG. 46, 105, 54, 137, 21; 29/576 E, 576 T; 136/245, 258; 156/DIG. 88; 357/59, 71; 430/5, 296, 942; 427/86, 88; 428/620

[56] References Cited

U.S. PATENT DOCUMENTS

| | | | |
|---|---|---|---|
| 3,433,677 | 3/1969 | Robinson | 136/245 X |
| 3,700,497 | 10/1972 | Epifano et al. | 29/578 X |
| 3,914,856 | 10/1975 | Fang | 29/572 |
| 3,961,997 | 6/1976 | Chu | 29/572 X |
| 4,028,206 | 6/1977 | King | 204/192 C |
| 4,040,083 | 8/1977 | Saiki et al. | 427/82 X |
| 4,059,461 | 11/1977 | Fan et al. | 148/1.5 |
| 4,187,126 | 2/1980 | Radd et al. | 148/174 X |
| 4,341,850 | 7/1982 | Coane | 430/11 |
| 4,433,202 | 2/1984 | Maruyama et al. | 136/258 PC |

FOREIGN PATENT DOCUMENTS 56-18445  2/1981  Japan .

OTHER PUBLICATIONS

Kaplan, L. H., "Metals as Resists for SiO$_2$ Etching" I.B.M. Tech. Discl. Bull., vol. 12, No. 12, May 1970, p. 2087.
Research Disclosure No. 18136, vol. 181, May, 1979.
"Thermal Conductivity of Metallic Elements and Alloys", vol. 1, *Thermophysical Properties of Matter*, (1970) (title pages only).

Primary Examiner—William G. Saba
Attorney, Agent, or Firm—Dana M. Schmidt

[57] ABSTRACT

There is disclosed a substrate having thereon a layer of a semiconductor material, and a method for depositing and heating the semiconductor material on the substrate, wherein the substrate comprises a layer of organic polymer, a layer of metal or metal alloy, and a layer of dielectric material wherein the layer of dielectric material has a surface, remote from the metal, that is contiguous with the semiconductor material.

4 Claims, 1 Drawing Figure

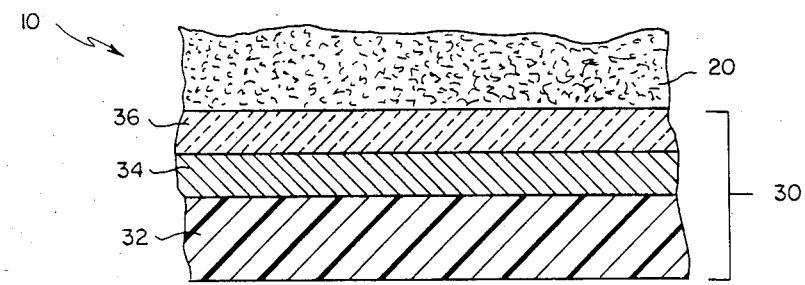

4,639,277

SEMICONDUCTOR MATERIAL ON A SUBSTRATE, SAID SUBSTRATE COMPRISING, IN ORDER, A LAYER OF ORGANIC POLYMER, A LAYER OF METAL OR METAL ALLOY AND A LAYER OF DIELECTRIC MATERIAL

FIELD OF THE INVENTION

This invention relates to a substrate and a layer of semiconductor material thereon and a method for making the combination.

BACKGROUND OF THE INVENTION

In certain usages, the need for making inexpensively semiconductor devices and systems using these devices is greater than the need for production methods giving the highest quality of semiconductor devices. For example, certain switches can be made from majority carrier semiconductor devices, on material which has more impurities and defects than is tolerable in the best minority carrier devices. That is, as is well known, a minority carrier device requires injection of carriers, e.g., electrons in p-type material, above the equilibrium amount where they would normally not be. If defects are present in sufficient amounts, these injected minority carriers do not survive. However, in majority carrier devices, injection of carriers above equilibrium amounts is not used, so that the presence or absence of defects is of much less importance. The majority carrier devices are attractive, however, only if they can be made at reduced cost.

One approach in manufacturing semiconductor devices is to vapor deposit polysilicon onto a substrate and convert the polysilicon into recrystallized silicon. Such an approach, however, requires deposition temperatures of about 1400° C. For the process to be inexpensive, and therefore useful in making inexpensive majority carrier devices, the substrate must be able to withstand such high temperatures while at the same time itself be selected from inexpensive materials. Because high temperature resistance generally requires the substrate to comprise less conventional, expensive materials, a dilemma has existed in attempts to use such inexpensive substrates. For example, high temperature resistance generally requires the use of refractory materials, such as quartz, ceramics or specialized glass, and such materials do not lend themselves to inexpensive manufacturing.

Prior to this invention a substrate comprising an organic polymer has not been described for use with semiconductor devices requiring processing at or above the noted temperature. Such a substrate has not been thought to be operable under such temperatures, since the organic polymer generally cannot tolerate such heat. Metal electrodes, although described heretofore as being sandwiched between various substrates and semiconductor layers, have not been part of the substrate itself.

SUMMARY OF THE INVENTION

I have discovered that an inexpensive substrate constructed as herein described can be prepared for inexpensive semiconductor devices, said substrate being capable of (a) dissipating the heat needed to process the device at temperatures of 1000° C. or more, to avoid damage to the substrate, and (b) providing a support for a device prepared from the semiconductor material.

More specifically, there is provided a substrate having thereon a layer of semiconductor material. The substrate comprises, in order, a layer of organic polymer, a layer of metal or metal alloy, and a layer of dielectric material. The layers of dielectric material and metal or metal alloy together have a thickness sufficient to dissipate the heat that occurs when the semiconductor material is heated to 1000° C., without causing significant decomposition or thermal expansion of the polymer layer. The dielectric material layer isolates the metal or metal alloy layer from the semiconductor layer.

Thus, this invention advantageously features an inexpensive substrate for a semiconductor device, which substrate nevertheless is capable of withstanding the high temperatures used to prepare such devices.

An additional advantageous feature of the invention is that there is provided a novel method of heating a semiconductor material to temperatures of at least 1000° C., using an inexpensive substrate.

Other advantageous features will become apparent upon reference to the following "Description of the Preferred Embodiments", when read in light of the attached drawing.

BRIEF DESCRIPTION OF THE DRAWING

The Figure is a fragmentary sectional view illustrating a substrate having thereon a layer of semiconductor material in accordance with the inven- tion.

DESCRIPTION OF THE PREFERRED EMBODIMENTS

The substrate of the invention is particularly preferred in making majority carrier semiconductor devices wherein the high temperatures used to process the semiconductor material arise locally for a limited duration of time because of a recrystallization of polysilicon to single crystal silicon, or to polycrystalline silicon of very large grain size, for example 1 to 100 μm. In addition, the substrate of this invention is particularly useful in making semiconductor devices of any type using non-silicon materials, which involve heating the semiconductor material to a temperature of at least 1000° C. for any reason, and not just for recrystallization. As used herein, processing of the semiconductor material refers to any step in the making of devices from the material, such as annealing, doping, bonding, and the like, requiring heating. That is, although the substrate is preferably intended to permit total recrystallization of polysilicon at a temperature of 1400° C., the substrate also permits processing at temperatures at or above 1000° C., for example to enlarge the polysilicon grains or to grow thermal oxide. As is well known, larger grains produced from smaller grains are beneficial because enhanced mobility arising from fewer boundary traps produces better performance of the semiconductor devices. As used herein, "large grain polysilicon" means those grains dimensioned from 2 to 100 μm.

The substrate is constructed with a layer of organic polymer, preferably as the bottommost layer. Then, in order, the substrate additionally comprises a layer of metal or metal alloy selected as described hereinafter, and a layer of dielectric material. The exposed surface of the dielectric material remote from the surface contacting the metal layer is then used to receive the semiconductor material. The dielectric material is present to electrically and chemically isolate the semiconductor material from the metal layer. This in turn prevents the metal layer from poisoning the semiconductor material formed on the substrate. In the absence of the dielectric material, metal atoms in significant quantity would undesirably diffuse into the semiconductor material upon heating to 1000° C. or higher.

It will be appreciated that the construction of the semiconductor device by converting polysilicon into single crystalline silicon or polysilicon with larger grains, involves localized high temperature heating only for short durations, i.e., less than 1 second. Useful examples include a limited duration of from $10^{-9}$ to $10^{-2}$ sec, applied to an area of from 1 to $10^5$ $\mu m^2$.

Many organic polymers are useful in forming the substrate of the invention. The polymer can be self-supporting, or it can be cast on the metal layer. Preferred are those having maximized heat resistance as hereinafter explained. In addition polymers having reduced heat resistance, including certain polyesters, e.g., poly(ethylene terephthalate), are also useful. In the latter case, if the Tg of the polymer is less than 200° C., the thicknesses of the dielectric layer and of the metal layer are adjusted as described in detail hereafter, so that the polymer will not decompose or significantly thermally expand when the semiconductor device is processed on the substrate at temperatures as high as 1000° to 1400° C. As used herein, "significant thermal expansion" means no greater than about 1%. In the case of a polymer having very low thermal resistance, it is most preferred that copper, silver or aluminum be selected as the metal, to assist in conducting the heat away from the polymer before thermal damage occurs to the polymer. Failure to conduct such heat away leads to melting or disintegration of the polymer, and a failure in the support provided to the device by the substrate.

As noted above, the most preferred polymers are those having maximized heat resistance, that is those having a Tg of at least 200° C. Thus, polyimides such as those available under the trademark "KAPTAN" from DuPont are useful. Particularly preferred are polymers comprising from 5 to 65 mole percent recurring units derived from dicarboxylic acids, organic diols and their derivatives, such that the polymer has a Tg of at least 200° C. Useful examples of such derivatives include the corresponding acids, acid chlorides, esters and anhydrides. Particularly useful examples are described as items A through M on page 290 of *Research Disclosure*, Vol. 181, Pub. No. 18136, May, 1979, the details of which are hereby expressly incorporated by reference. (*Research Disclosure* is published by Kenneth Mason Publications, Ltd., The Old Harbourmaster's, 8 North St., Emsworth, Hampshire P010 7DD, ENGLAND.) Included are, e.g., polymers containing as recurring units, 4,4'-(hexahydro-4,7-methanoindan-5-ylidene)-diphenylene terephthalate.

With respect to the metal layer contacting the layer of organic polymer, any elemental metal, or an alloy thereof, is useful to form such layer. "Metal" is understood to mean the elements listed as such in "Thermal Conductivity of Metallic Elements and Alloys", Vol. 1, *Thermophysical Properties of Matter* (1970). As will be readily apparent, most preferred are metals with the highest thermal conductivity. These include, in approximate descending order of thermal conductivity, silver, copper, gold, aluminum, polycrystalline beryllium, tungsten, magnesium, iridium, molybdenum and the like. The choice of the metal will depend in part on the thickness of the metal layer, as well as the thickness of the dielectric layer and the Tg of the polymer layer.

That is, the thickness of the polymer layer is of little consequence in providing adequate heat dissipation, compared to the effects provided by the metal layer and the dielectric layer. Thus, for heat dissipation the critical thicknesses reside in the dielectric layer and in the metal layer. The thicker the dielectric layer, the longer it takes for the metal layer and thus the polymer layer to heat up. Or, given a particular thickness for the dielectric layer, even metals with a relatively poor thermal conductivity or a melting point lower than 1000° C. are useful if the metal layer is made to be thick enough. That is, within the preferred range of thicknesses for the dielectric layer, the heating of the metal occurs isothermally in the direction of the thickness dimension, so that the surface of the metal cannot melt without the entire metal thickness being heated to the melt temperature. However, to avoid using extremely thick metal layers, e.g., those greater than about 1000 $\mu$m, the preferred metal or alloy thereof is one having a thermal conductivity at 300°K which is at least as high as that of polycrystalline tin. The thermal conductivity of polycrystalline tin is listed in the aforesaid Vol. 1 as 0.67 watt $cm^{-10}K^{-1}$("recommended"). References herein to the thermal conductivity of such tin mean this particular value.

The metal layer is considered to be essential to the practice of this invention as, without it, the polymers described above tend to deteriorate or be vaporized under the heating conditions described.

After formation of the metal layer, a layer of dielectric material is formed. Any dielectric is useful, wherein "dielectric" means those materials having low electrical and thermal conductivity. Most preferred is silicon dioxide, but others such as silicon nitride, sapphire and $Al_2O_3$ are also useful.

Useful thicknesses for the polymer layer, the metal layer and the dielectric layer include those between 1 and 1000 $\mu$m. The thickness of the polymer layer is selected to provide adequate support for the semiconductor device. Thicknesses as large as 1 cm are also useful for the polymer layer. If the Tg of the polymer is below 200° C., the thicknesses of the dielectric layer and of the metal layer are at the high end of the noted ranges to prevent thermal damage to the polymer layer, as noted.

As shown in the FIGURE, the semiconductor device 10 comprises single crystalline silicon or large grain polysilicon 20 formed on substrate 30. The substrate in turn comprises, from the bottom up, a layer 32 of the organic polymer, a layer 34 of the metal or metallic alloy, and a layer 36 of the dielectric material. The actual electrical components of device 10 are omitted for clarity.

The organic polymer described above is preferably deposited as a layer out of a solution, or extruded or pressed, and the solvent evaporated. Thereafter, the metal layer is vapor deposited, sputtered, or otherwise formed at low temperatures onto the layer of organic polymer. Alternatively, the polymer can be coated onto the metal layer.

Following these steps, a layer of silicon dioxide is formed on the metal, such as by reactive evaporation at $10^{-4}$ torr ($10^{-2}$ N/m²) oxygen pressure, and the substrate is ready for device fabrication.

Device fabrication proceeds by a variety of conventional steps. Most preferred are those that include the process of depositing polysilicon onto the layer of silicon dioxide, such as by crown evaporation, and thereafter recrystallizing the polysilicon into single crystal silicon, such as by laser exposure. Melt recrystallization occurs at temperatures of 1400° C. or higher. Alternatively, as noted, some improvement in the grain size of the material may occur at lower temperatures (e.g., 1000° C.).

Further steps in the making of a device, such as doping, ion implanting, diffusing, etching, and electrode-forming, are all conventional and require no further elaboration.

EXAMPLE

The following example further illustrates the invention.

A 10 $\mu$m thick layer of a homopolymer of 4,4'-(hexahydro-4,7-methanoindan-5-ylidene)diphenylene terephthalate was coated by vacuum deposition with a 2 $\mu$m-thick layer of tin. A 2 $\mu$m layer of SiO$_2$ was then deposited onto the polycrystalline tin by reactive evaporation of SiO$_2$ using a vacuum of $10^{-2}$ N/m$^2$ oxygen. A final coating of 4000 Å of polysilicon was deposited onto the substrate so formed. When the polysilicon was heated by a cw laser having a dwell time of 1 to 1000 cm per sec, with a beam diameter of 10 to 1000 $\mu$m, the grain size was increased markedly to about 5 to 20 $\mu$m and the substrate remained undamaged.

The invention has been described in detail with particular reference to preferred embodiments thereof, but it will be understood that variations and modifications can be effected within the spirit and scope of the invention.

What is claimed is:

1. A substrate having thereon a layer of semiconductor material containing one or more majority carrier semiconductor devices, said substrate comprising, in order, a layer of organic polymer;

a layer of metal or metal alloy;

and a layer of dielectric material completely isolating said metal or metal alloy later from said semiconductor material;

said dielectric layer and said metal or metal alloy layer together having thickness that are sufficient to disipate the heat that occurs when said semiconductor material is heated to 1000° C., without causing significant decomposition or thermal expansion of said polymer layer.

2. A substrate and semiconductor layer as defined in claim 1, wherein said polymer comprises from 5 to 65 percent recurring units derived from dicarboxylic acids, organic diols and their respective derivatives such that said polymer has a Tg of at least 200° C.

3. A substrate and semiconductor layer as defined in claim 1, wherein said metal or metal alloy has a thermal conductivity at 300° K which is at least as large as that of polycrystalline tin.

4. A substrate and semiconductor layer as defined in claim 1, wherein said dielectric layer comprises SiO$_2$ and said semiconductor layer comprises large grain polysilicon or single crystalline silicon.

* * * * *